United States Patent [19]
Cleemput et al.

[11] Patent Number: 4,573,406
[45] Date of Patent: Mar. 4, 1986

[54] SCREEN PRINTING DEVICE

[75] Inventors: Camiel D. E. Cleemput, Wondelgem-Gent; Hedwig L. Z. Coussement, Nevele, both of Belgium

[73] Assignee: International Standard Electric Corporation, New York, N.Y.

[21] Appl. No.: 657,847

[22] Filed: Oct. 4, 1984

[30] Foreign Application Priority Data

Oct. 6, 1983 [BE] Belgium ............................ 60222

[51] Int. Cl.[4] ................. B41L 13/02; B41L 13/12; B41F 15/36
[52] U.S. Cl. ......................... 101/127.1; 101/128.1; 101/DIG. 12; 33/184.5
[58] Field of Search ............... 101/114, 115, 123, 124, 101/126, 127, 127.1, 128.1, DIG. 12; 33/180 R, 184.5

[56] References Cited

U.S. PATENT DOCUMENTS

3,192,844 7/1965 Szasz .............................. 33/184.5
4,005,651 2/1977 Sigel .............................. 101/128.1
4,473,007 9/1984 Colineau ........................ 101/127.1

Primary Examiner—William Pieprz
Assistant Examiner—William L. Klima
Attorney, Agent, or Firm—John T. O'Halloran; Jeffery P. Morris

[57] ABSTRACT

A screen printing device including a work table having a printing position with a holder to retain a substrate in the printing position, a holder for a screen provided with a mask, the mask having referenced portions, a microscope, an adjuster for positioning the table, screen holder and microscope, and further includes a template with reference portions corresponding to the reference portions of the mask, the work table having at least one hole with associated illumination means to simultaneously illuminate the corresponding reference portions of the mask and of the template held in the printing position by the holder in order to be able to adjust, with the help of the adjuster, the relative position of the reference portions of the template and the reference portions of the mask when viewed through the microscope.

17 Claims, 16 Drawing Figures

SCREEN PRINTING DEVICE

BACKGROUND OF THE INVENTION

The present invention relates to a screen printing device including a work table having a printing position, means on said work table for holding an object, e.g. a substrate, in said printing position, a holder for a screen provided with a mask, a microscope and means for adjusting the relative positions of said table, said screen holder and said microscope.

Such a screen printing device for printing on a substrate is well known in the art, e.g. the Model 155 S Screen Printer manufactured by the PRESCO division of the US firm AMI (Affiliated Manufacturers Inc.). In this known device the work table is movable from an initial position located below an adjustable film holder to a printing position located below the screen mask holder and vice versa. To make a same print on several substrates the device operates as follows. After a reference film—usually the photopositive from which the mask was imaged—has been inserted in the film holder and an auxiliary substrate has been positioned on the work table, the latter is moved into its printing position and at least one trial print is made on this auxiliary substrate. Thereafter, the work table with the auxiliary substrate is brought back into its initial position under the film holder the position of which is then adjusted with respect to the print on the auxiliary substrate with the help of the microscope and of film holder adjustment means until reference strips on the film exactly match with reference strips on the auxiliary substrate. The printed auxiliary substrate is then removed as the device is ready for making a same but definitive print on several substrates. Prior to each such a printing operation reference strips on each of these substrates must however be aligned with the reference strips on the film by means of the microscope and of work table adjustment means.

Summarizing, with the known device, when a same print has to be made on several substrates, first a number of preparatory operations (trial print, film holder adjustment) have to be performed in common for all these substrates, and prior to each definitive printing operation on a substrate a work table adjustment has to be executed. Also several prints may be successively made on a same substrate by proceeding in the above described way for each such print. But because prior to each print a reference film has to be aligned with the reference strips on the substrate, it is clear that the precision with which each print is executed decreases with the number of prints as the alignment errors cumulate.

An object of the present invention is to provide a screen printing device of the above type but which does not need a trial print and wherein the alignment of the mask and the object is enabled in an easy, fast and accurate way.

According to the invention this object is achieved due to the fact that the device further includes a template with reference portions corresponding to reference portions of said mask and that said work table has at least one hole with associated illumination means to simultaneously illuminate said corresponding reference portions of said mask and of said template held in said printing position by said holding means in order to be able to adjust, with the help of said adjustment means, the relative position of said reference portions when viewed through said microscope.

In this screen printing device, first the template is positioned in the printing position of the work table and held therein by the holding means. Then the screen holder carrying the mask is brought in the immediate proximity of the template in such a way that both reference portions of the mask and corresponding reference portions of the template are located in the center of an illuminated hole of the work table and may be simultaneously viewed through the microscope. With the help of the adjusting means the reference portions of the mask are then aligned with those of the template so that this mask is then correctly positioned with respect to the printing position on the work table. The device is then ready for executing a printing operation on a substrate when the latter is substituted for the template in the printing position. Hence, no trial print is necessary and once the position of the mask has been fixed successive substrates may be printed without any further adjustment. This obviously increases the speed of production and ensures a correct and constant alignment for all the substrates. In case a number of consecutive prints with different masks has to be made on a same substrate, the previously described alignment has to be executed between each mask and the template prior to each print. But because each of these alignments is performed with respect to the same references on the template, possible positioning errors never cumulate so that the accuracy obtained is very high.

The above mentioned and other objects and features of the invention will become more apparent and the invention itself will be best understood by referring to the following description of an embodiment taken in conjunction with the accompanying drawings in which:

DESCRIPTION OF THE PREFERRED EMBODIMENT

With the present screen printing device a number of electric circuits can be successively printed in a same surface of a substrate and thus be used to produce a multi-layer printed circuit.

This device includes, among many other elements, an adjustable work table 1 (FIGS. 1, 2), an adjustable screen holder mounted above the work table 1, a movable squeegee arranged above the screen holder, an adjustable microscope mounted above the screen holder, and means to adjust the position of the work table 1, the screen holder and the microscope. Because they are well known in the art and moreover not needed to explain the invention the squeegee, the screen holder and the microscope and their associated adjustable positioning means are not represented. Also the adjustable positioning means of the work table 1 are not shown.

Figure 4:
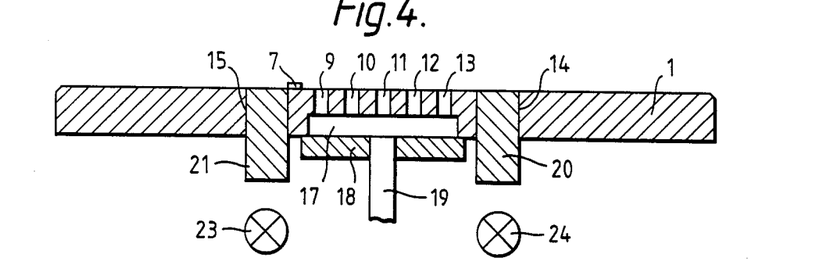
FIG. 4 is a cross-section along line IV—IV of FIG. 1 considered in the direction of the arrows.

The work table 1 (FIGS. 1-4) has a printing position 2 for a substrate 3 which is schematically represented in dash-dot lines and is provided with a cavity which houses a device, generally indicated by reference numeral 4, for correctly positioning the substrate 3 in this printing position 2. The printing position 2 is delimited by three stationary cylindrical abutments 5, 6, 7 and by a movable abutment 8 forming part of the positioning device 4. The table 1 is further provided with 25 cylindrical holes, such as 9 to 13, arranged in a square matrix of 5 rows and 5 columns, and three cylindrical positioning holes 14, 5 and 16 the centres of which are disposed at the apexes of a right-angled triangle whose orthogonal sides are parallel to the sides of the right-angled triangle formed by the abutments 5, 6 and 7. The rows and columns of the square matrix formed by the suction holes are also parallel to these orthogonal sides. The suction holes such as 9 to 13 communicate with a vacuum chamber 17 (FIG. 4) which is closed at the bottom by a cover 18 and communicates with a pump (not shown) through a conduit 19. Light guides 20, 21, and 22 are mounted in the positioning holes 14, 15 and 16 respectively and are each illuminated by an associated lamp, such as 23 and 24 shown in FIG. 4.

Figure 1:
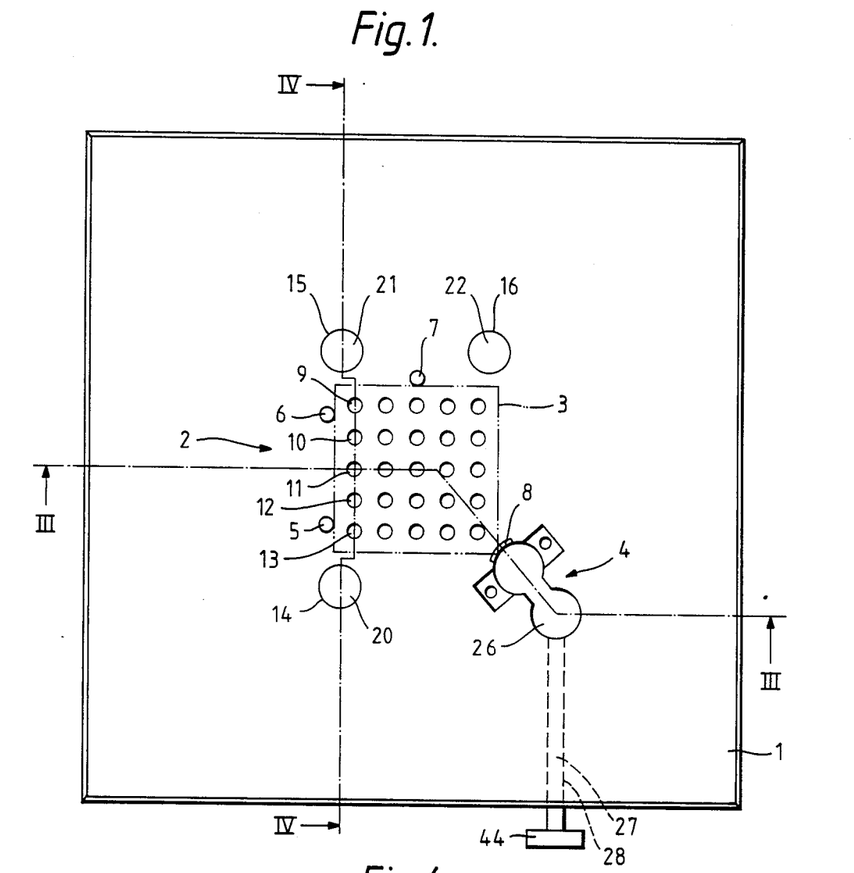
FIG. 1 is a top plan view of a work table 1, a substrate 3 and a positioning mechanism 4 of a screen printing device according to the invention.

The positioning device 4 (FIGS. 1 and 5 to 9) includes a positioning mechanism 25 mounted in a cavity 26 of the work table 1 and a control rod 27 for this mechanism, mounted in a cylindrical bore 28 of this table 1 (FIG. 1).

Figure 5:
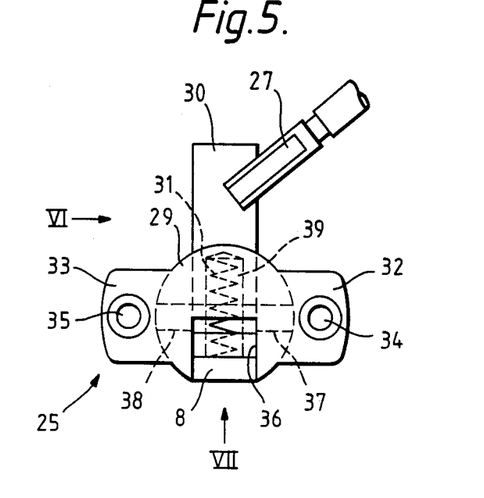
FIG. 5 is a top plan view of the positioning mechanism 4 of FIG. 1 but on an enlarged scale.
Figure 6:
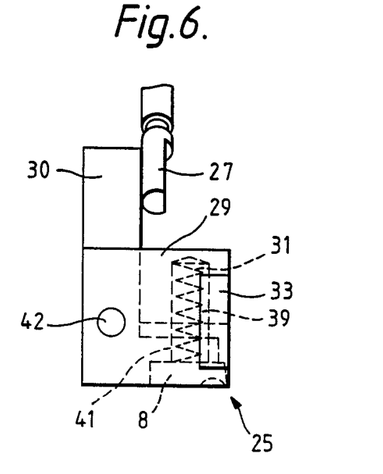
FIG. 6 is a side view of FIG. 5 in the direction of arrow VI.
Figure 7:
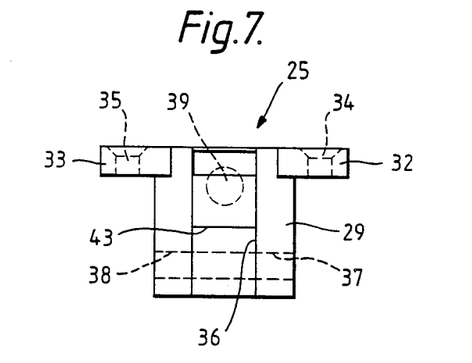
FIG. 7 is a front view of FIG. 5 in the direction of arrow VII but with lever 30 removed.

The positioning mechanism 25 comprises a cylindrical body 29, an L-shaped lever 30 and a helical spring 31. The cylindrical body 29 has two lateral flanges 32 and 33 with chamfered screw holes 34 and 35 respectively, and a recess 36 extending at the front side over the whole height of the body and at the rear side only over part of this height considered from the bottom of the body. The body 29 further presents two coaxial cylindrical bores 37 and 38 which open in the cavity 36 and a cylindrical blind bore 39 which is perpendicular to the bores 37 and 38 whose axes are parallel to a line joining the centres of the screw holes 34 and 35.

Figure 8:
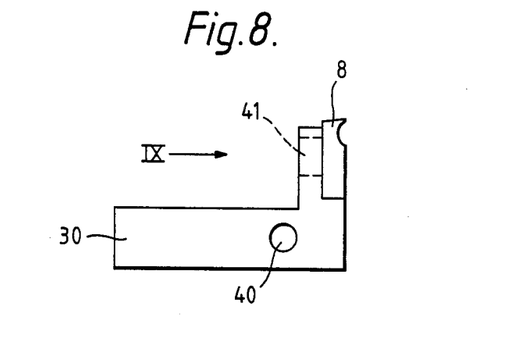
FIG. 8 is a side view of this lever 30.
Figure 9:
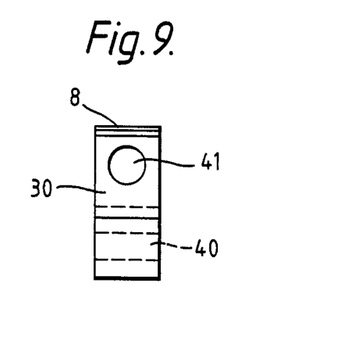
FIG. 9 is a front view of FIG. 8 in the direction of arrow IX.

The L-shaped lever 30 is provided with the above mentioned abutment 8 made of steel at one of its ends and further has a cylindrical hole 40 and a cylindrical blind bore 41. It is pivotally mounted in the body 29 by means of an axle 42 mounted in the bores 37, 38 and hole 40. The above mentioned spring 31 is arranged in the bores 39 and 41 of the body 29 and the lever 30 respectively. Thus the latter lever 30 is continuously urged into an operative position wherein its longest arm abuts against the upper edge 43 (FIG. 7) of the recess 36, and wherein the abutment 8 protrudes out of the body 29 and is able to make contact with a corresponding corner of the substrate 3.

The control rod 27 has one end with a semi-circular cross-section and another end provided with a control knob 44. By rotating the rod 27 with the help of knob 44 the lever 30 is pivoted from an operative position to an inactive position or vice versa.

Figure 10:
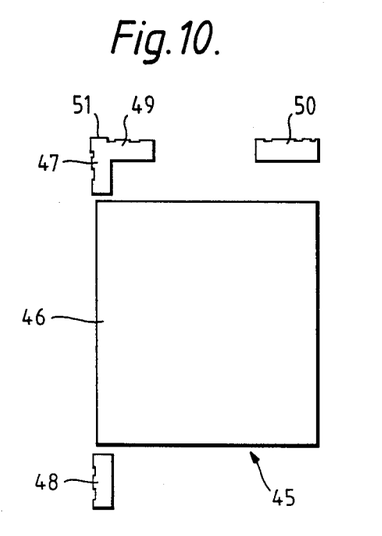
FIG. 10 is a top plan view of a mask formed on a screen of a screen printing device according to the invention.
Figure 16:
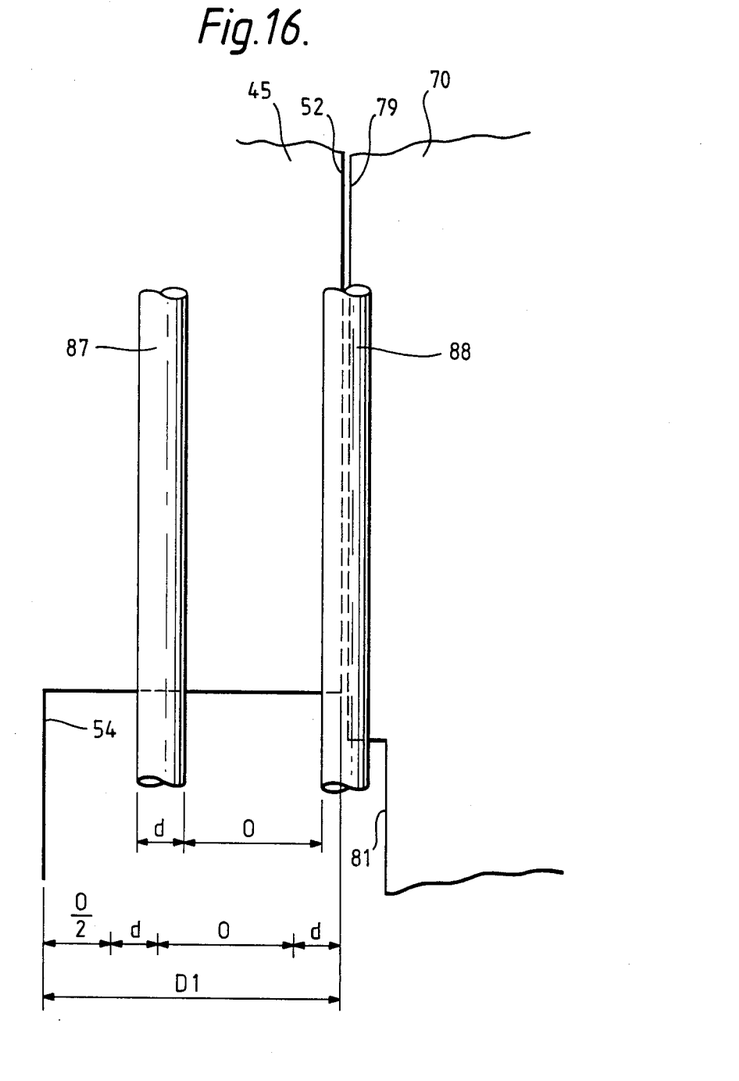
FIG. 16 shows parts of the template 70 of FIG. 15 superposed on part of the mask 45 of FIG. 11 but on an enlarged scale.

The screen of the above mentioned screen holder (not shown) of the present screen printing device carries an emulsion of which parts constituting a mask 45 are removed. A portion of this mask is shown in FIG. 10, the black parts constituting the mask itself, i.e. openings in the emulsion, and the white parts being constituted by the emulsion. The portion of the mask 45 shown includes an electric circuit 46 of which only the square periphery is represented and reference portions 47 to 50 which are arranged along the orthogonal sides of a right-angled triangle with the portions 47 and 48 in line with an edge of the circuit 46. The mask portions 47, 49 and 48 are shown on an enlarged scale in FIGS. 11 and 12 respectively. The reference portions 47 and 49 are joined by a corner piece 51. Reference portion 47 is constituted by a number of staircase-shaped portions comprising aligned rectilinear first reference strips such as 52, 53 and aligned second and third rectilinear strips such as 54, 55 and 56, 57 which are at a distance D1 (FIG. 16), D2 (not shown) from the aligned first reference strips 52, 53. These distances have been chosen in function of the parameters of different screens on which a mask may be formed, i.e. the opening O (FIG. 16) which is the distance between two adjacent screen wires and the diameter d of these wires. More particularly $$D_{1,2} = 3/2O + 2d$$

as shown in FIG. 16. This relation has been empirically obtained and is such that at least one wire 87 (FIG. 16) of the screen is located in the area delimited by the aligned first reference strips such as 52, and the aligned second strips, such as 4 and such that this wire is at a sufficient distance from these strips.

Figure 11:
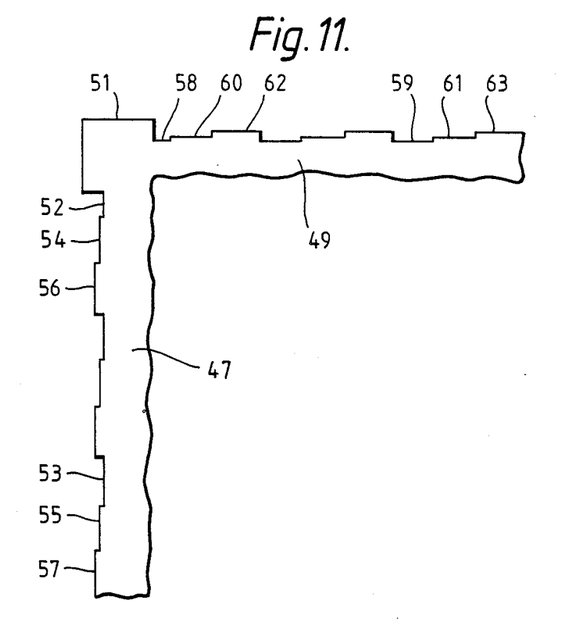
FIGS. 11 and 12 are top plan views on an enlarged scale of parts 47, 49 and 48 of FIG. 10 respectively.
Figure 12:
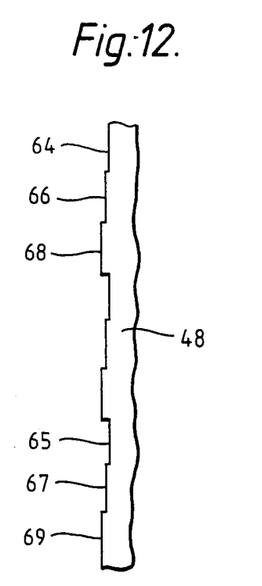

Likewise reference portion 49 is constituted by a number of staircase-shaped portions comprising first reference strips 58, 59 and second and third strips 60, 61 and 62, 63. Reference portion 48 comprises first reference strips 64, 65 and second and third strips 66, 67 and 68, 69.

Figure 2:
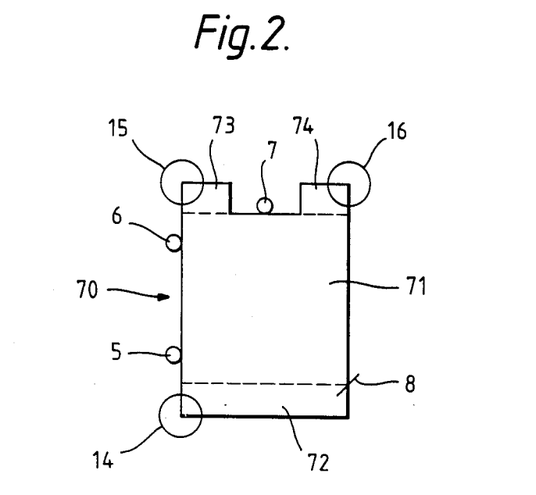
FIG. 2 is a top plan view of part of the work table 1 of FIG. 1 with a template 70 positioned thereon.
Figure 3:
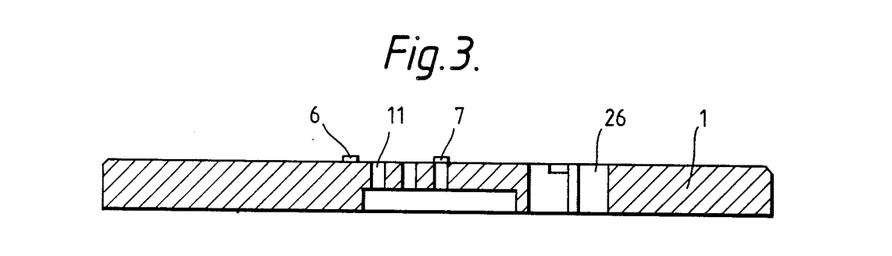
FIG. 3 is a cross-section along line III—III of part of FIG. 1 considered in the directions of the arrows.
Figure 13:
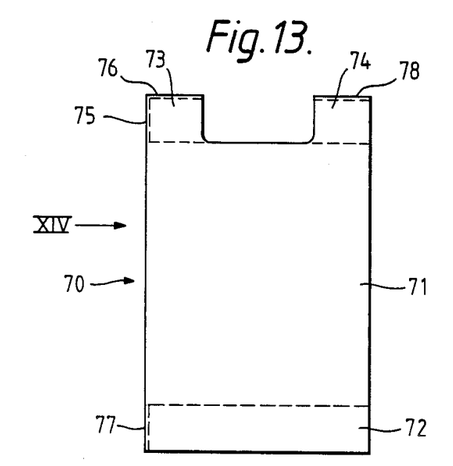
FIG. 13 is a top plan view of the template 70 already shown in FIG. 2.
Figure 14:
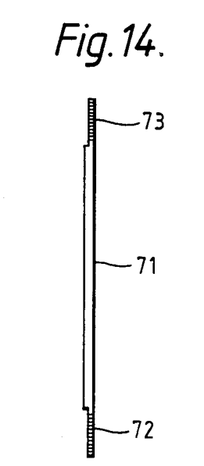
FIG. 14 is a side view of FIG. 13; in the direction of arrow XIV.

The present screen printing device also includes a template 70 (FIGS. 2 and 13-15) with a thicker square central body 71 having a shape and size identical to those of the substrate 3 and thinner end flanges 72, 73 and 74. The body 71 and the flanges 72 to 74 have a common upper plane (FIGS. 2, 13). As visible on FIG. 2, these end flanges have a length equal to the distance between the body 71 and the centre of the openings 14, 15 and 16 of the work table 1. The width of end flange 72 is equal to that of the body 71, whereas that of the end flanges 73, 74 is such that the template 70 maybe positioned in the printing position 2 without being hindered by the abutment 7. As the end flanges 72 to 74 are at a certain distance from the upper surface of the work table 1 when the template is in the printing position 2, the abutment 8 can be brought into contact with the adjacent corner point of the body 71 of the template 70 (FIG. 2) to correctly position the latter in the printing position 2, just as the above mentioned substrate 3.

Figure 15:
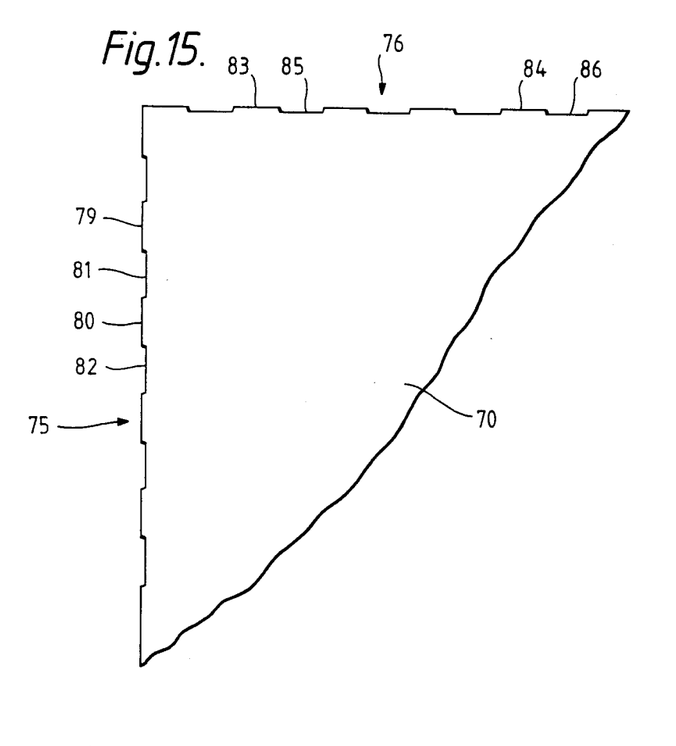
FIG. 15 is a top plan view on the same scale as FIG. 12, of parts 75 and 76 of the template 70 of FIG. 13.

The edge flanges 73, 72 and 74 have staircase-shaped reference portions 75, 76; 77 and 78 respectively which are arranged along the orthogonal sides of a right-angled triangle and of which 75 and 76 are represented on an enlarged scale in FIG. 15, this scale being the same as that of FIGS. 11 and 12. The reference portion 75 comprises aligned rectilinear first strips such as 79 and 80 and aligned rectilinear second strips such as 81 and 82 and the reference portion 76 likewise comprises aligned first reference strips 83 and 84 and aligned second strips 85 and 86. The strips 81, 82 and 85, 86 are e.g. at a distance equal to 0.03 mm from the aligned strips 79, 80 and 83, 84 respectively. The reference portions 77 and 78 are similar to 75 and 76.

The above described screen printing device operates as follows.

After the mask 45 has been formed on the screen of the screen holder, the template 70 is brought in the printing position 2 of the work table 1. By rotating the control rod 27 of the positioning device 4 the movable abutment 8 is made to exert a pressure on the adjacent corner point of the body part 71 of the template 70 two sides of which are thus brought into contact with the abutments 5, 6 and 7. As a consequence this template 70 is correctly positioned in the printing position 2. Therein it is held by suction through the suction holes such as 9 to 13 (FIG. 2) and in this position its other corner points are located in the centre of the illuminated holes 14, 15 and 16 respectively. The screen holder carrying the mask 45 is then brought in the immediate proximity of the template 70 and in such a way that either one of the pairs of reference portions 47 and 75, 48 and 77, 49 and 76 or 50 and 78 can be simultaneously viewed in the microscope.

When for instance the reference portions 75 and 76 of the template 70 and 47 and 49 of the mask 5 are viewed, then one sees these portions on an enlarged scale as shown in FIGS. 15 and 11 respectively. By using the adjustable positioning means of the work table 1 and/or of the screen holder, the reference strips such as 52 and 53 of the mask 45 are aligned with the reference strips such as 79 and 80 of the template 70. Likewise, the reference strips such as 58 and 59 of the mask are aligned with the reference strips such as 83 and 84 of the template 70.

Bearing in mind that in the microscope parts of the screen covered by the emulsion and the template appear as black surfaces, whereas the mask proper appears as an open part in the emulsion it is difficult to align—without precautions—the reference strips of the template with those of the mask. For instance, one could—by error—align the reference strips of the template with a wire of the screen instead of with a mask edge, especially when such a wire is close to the mask edge or is even covered thereby. FIG. 16 for instance shows screen wire 88 partially covered by reference strip 52 of the edge of the mask edge 45.

However, due to the presence of the strip 54 of the mask and because of the illumination from below, it is possible to see the screen wire 87 and to deduce therefrom—with a little practice—the position of the screen wire 88, even when the latter is fully covered by the emulsion, and to align a reference portion 79 of the template with a reference strip 52 of the mask. FIG. 16 shows the mask edge and the template prior to this alignment.

It should be noted that due to the edge of the template having strips 81, 82 and because of the illumination from below, these strips facilitate the abovealignment.

Another way to avoid this inconvenience is to realize the mask in such a way that the reference strips, such as 2, are located between two adjacent screen wires.

After the template 70 and the mask 45 on the screen have thus been correctly positioned with respect to each other, a substrate 3 is substituted for the template 70 and correctly positioned in the printing position 2. As this substrate 3 exactly has the same shape and size as the body 71 of the template 70, it is automatically correctly positioned with respect to the mask 45. The device is now ready for a series of printing operations.

After every such printing operation the template 70 is substituted for the substrate 3 and aligned with a new mask, etc. Thus one is sure that the various layers printed in succession on the substrate are correctly aligned.

While the principles of the invention have been described above in connection with specific apparatus, it is to be clearly understood that this description is made only by way of an example and not as a limitation on the scope of the invention.

We claim:

1. Screen printing device including a work table having a printing position, means on said work table for holding a substrate in said printing position, a holder for a screen provided with a mask, said mask having reference portions, a microscope, and means for adjusting the relative positions of said table, said screen holder and said microscope, wherein it further includes a template with reference portions corresponding to said reference portions of said mask (45), said work table (1) having at least one hole with associated illumination means to simultaneously illuminate said corresponding reference portions of said mask and of said template held in said printing position by said holding means in order to be able to adjust, with the help of said adjustment means, the relative position of said reference portions of said template and said reference portions of said mask when viewed through said microscope.

2. Screen printing device according to claim 1, wherein said template has a body with shape and size identical to those of said substrate and flanges provided with said reference portions, said holding means being able to hold said body in said printing position.

3. Screen printing device according to claim 1, wherein each of said reference portions of said mask comprises a plurality of staircase-shaped portions with aligned corresponding rectilinear strips, first and second ones of which are located at predetermined distances from each other.

4. Screen printing device according to claim 3, wherein said predetermined distance is such that at least one wire of said screen is located in the area delimited by said aligned first strips and said aligned second strips.

5. Screen printing device according to claim 4, wherein said distance is equal to the value $2d + 3/2O$ wherein d is the thickness of said screen wire and O is the distance between immediately adjacent screen wires.

6. Screen printing device according to claim 3, wherein said reference portions of said mask are arranged along the sides of a right-angled triangle and outside the mask of an electrical circuit to be printed on said object.

7. Screen printing device according to claim 6, wherein one side of said right-angled triangle coincides with an edge of said circuit mask.

8. Screen printing device according to claim 6, wherein said template has a body with shape and size identical to those of said object and flanges provided with said reference portions, said holding means being able to hold said body in said printing position, and that said reference portions of said template are located along sides of a right-angled triangle and outside said body.

9. Screen printing device according to claim 8, wherein said work table has three holes which are disposed at the corner points of a right-angled triangle corresponding to said right-angled triangles of said mask and of said template in such a way that when said template and said mask are located in said printing position on said work table said reference portions of said template and of said mask are located above said holes and illuminated by said illumination means.

10. Screen printing device according to claim 9, wherein said illumination means are mounted below said holes.

11. Screen printing device according to claim 10, wherein, light guides are mounted in said holes.

12. Screen printing device according to claim 9, wherein said printing position is delimited by three stationary abutments and by a movable abutment which forms part of said holding means said stationary abutments being disposed along the sides of a right-angled triangle corresponding to the right-angled triangle delimited by said holes and said holding means being able to push said object or said template into contact with said stationary abutments.

13. Screen printing device according to claim 12, wherein said movable abutment is provided at the end of a first arm of an L-shaped lever which is pivoted in said work table and whose second arm is controlled by a spring and by a control rod which is able to pivot said lever against the action of said spring.

14. Screen printing device according to claim 1, wherein each of said reference portions of said template comprises a plurality of staircase-shaped portions with aligned corresponding rectilinear strips first and second ones of which are located at predetermined distances from each other.

15. Screen printing device according to claim 2 wherein said reference portions of said template are located along the sides of a right-angled triangle and outside said body.

16. Screen printing device according to claim 15, wherein one side of said right-angled triangle coincides with an edge of said body.

17. Screen printing device according to claim 15, wherein each of said reference portions of said template comprises a plurality of staircase-shaped portions with aligned corresponding rectilinear strips, first and second ones of which are located at predetermined distances from each other.

* * * * *